United States Patent [19]

Pascual et al.

[11] Patent Number: 5,315,271

[45] Date of Patent: May 24, 1994

[54] PROCESS AND DEVICE FOR SYNCHRONIZING TWO DIGITAL PULSE SEQUENCES S AND RF OF THE SAME HIGH FREQUENCY

[75] Inventors: Nathalie Pascual, Prades le Lez; Christophe Fleury, Fontenilles; Georges Sagnes, Saint Gely du Fesc; Christian N'Guyen, Blagnac; Jacques Lassale, Montpellier, all of France

[73] Assignee: Aerospatiale Societe Nationale Industrielle, Paris, France

[21] Appl. No.: 894,246

[22] Filed: Jun. 8, 1992

Related U.S. Application Data

[63] Continuation-in-part of Ser. No. 804,109, Dec. 6, 1991, abandoned.

[30] Foreign Application Priority Data

Dec. 10, 1990 [FR] France ............................... 90 15424

[51] Int. Cl.$^5$ ...................... H03L 7/085; H03L 7/099
[52] U.S. Cl. ........................................ 331/25; 331/34; 331/57
[58] Field of Search ...................... 331/17, 25, 34, 49, 331/57

[56] References Cited

U.S. PATENT DOCUMENTS

| | | | |
|---|---|---|---|
| 4,121,171 | 10/1978 | Schollmeier | 331/1 A |
| 4,517,532 | 5/1985 | Neidorff | 331/57 |
| 5,075,640 | 12/1991 | Miyazawa | 331/10 |

*Primary Examiner*—David Mis
*Attorney, Agent, or Firm*—Michael N. Meller

[57] ABSTRACT

Device for synchronizing two constant high frequency digital pulse sequences S and $R_f$ comprising a first oscillator producing the frequency sequence $R_f$ at the fundamental frequency f and a second oscillator producing the frequency sequence of pulses S also at the frequency f. The second oscillator is a ring oscillator having three loops of inverted logic gates connected in series and corresponding respectively to the frequency f (used if synchronism exists), to a higher frequency $f_1$ (used if there is a phase lag) and a lower frequency $f_2$ (used if there is a phase lead) with the choice of the operating loop being made by a multiplexer on the basis of instructions from a phase detector permanently comparing the synchronism, lead or lag state of the sequence S compared with the sequence $R_f$.

6 Claims, 3 Drawing Sheets

S IS LATE

S IS LEAD

PROCESS AND DEVICE FOR SYNCHRONIZING TWO DIGITAL PULSE SEQUENCES S AND RF OF THE SAME HIGH FREQUENCY

CROSS-REFERENCES TO RELATED APPLICATIONS

The present application is a continuation in part application of U.S. application Ser. No. 804,109 filed Dec. 6, 1991, now abandoned.

BACKGROUND OF THE INVENTION

The present invention relates in general terms to devices making it possible to synchronize with one another, the oscillations of two sequences of periodic signals having a high frequency, which is identical or very substantially identical. Such systems have numerous applications, one of the most important being the synchronization of clock signals.

Throughout the remainder of the present text, S will be used for designating pulses emitted by an oscillator, whereof it is wished to make the phase dependent on those of the reference pulses $R_f$, whose frequency is clearly determined, stable and high.

In general terms, the synchronization of the oscillations of two sequences of periodic pulses of this type has hitherto been carried out with the aid of devices known under the name phase locked loops. Phase locked loops use the principle of phase-frequency servocontrol, whereof briefly the known principle will be described with reference to the attached FIG. 1.

A known phase locked loop essentially comprises an oscillator 2 emitting a sequence of pulses S, a reference oscillator 4 emitting the pulse sequence $R_f$ or reference pulses at a given, stable frequency. The two pulse sequences S and $R_f$ are simultaneously fed into a detector or phase comparator 6, which at the output emits to a dephasing correction system 8 an electrical signal characteristic of the phase deviation possibly measured between the pulses S and $R_f$. The phase corrector 8, optionally associated with a simple filter, in turn supplies to the oscillator 2 the time correction signal making it possible to displace the frequency of said oscillator 2 to bring it into phase at all times with that of the oscillator 4. When the loop is closed in this way, the oscillator 2 is made dependent in a quasi-perfect manner on the reference oscillator 4 and the sequence of pulses S is available in quasi-perfect synchronism with that of the oscillator 4. Such a known device is in particular described in U.S. Pat. No. 4,121,171.

It is clear that one of the important properties of a servocontrol of this type is its capacity to react very rapidly to the appearance of a phase shift without itself producing instabilities in operation. The stabilities linked with narrow band oscillators and it is desirable, for a high frequency and therefore high speed operation, to have an oscillator with a minimum complexity and which does not have any reactive elements other than the inevitable parasitic capacitances.

In order to produce such a known device according to FIG. 1, two different technologies exist, namely analog constructions and digital constructions. In both cases, the performance characteristics of such a phase locked loop are essentially linked with the characteristics of its internal oscillator 2, which is in fact its main component. On using an analog oscillator, a good frequency stability is obtained due to the crystal oscillators. This stability is associated with the very narrow resonant band of said oscillators, which prevents any possibility of significant frequency variations and therefore rapid resynchronization. Unfortunately in phase locking devices using analog corrections, there is still a significant possibility of interference, which can sometimes lead to a very unstable operation. Moreover, the technological dispersion of said equipments from the manufacturing standpoint can lead to other problems, which are very difficult to control.

Digital oscillators have also been used in phase locked loops. They have the advantage of their stability, their ease of simulation and also simplicity of design. However, their operation is based on a correction principle by variable integral division of a periodic signal from an internal oscillator, so that they are subject to the frequency being exceeded when the oscillating frequency e.g. exceeds 1 megahertz and oscillations occur around the centre frequency, which makes their operation difficult. Thus, in this case the synchronization correction which would have to be provided can be excessive compared with the use frequency.

SUMMARY OF THE INVENTION

The present invention is directed at a process and a device for synchronizing two pulse sequences, whereof one serves as a reference for the other and which makes it possible by using simple means and digital electronics, to reconcile the advantages associated with analog oscillators on the one hand and digital oscillators on the other. In other words, the process and device according to the invention permit a phase locked loop operation with a stable, high frequency and an excellent digital control of the frequency correction.

The process and device according to the invention have external similarities with the previously described phase locked loops, but operate in an original and completely different manner, as will be shown hereinafter.

This synchronization process for maintaining in the vicinity of zero the average phase shift between two digital pulse sequences S and $R_f$ of the same fundamental frequency f consists of:

using a first for oscillator for supplying the reference frequency sequence $R_f$ of logic signals 0 and 1 at the constant fundamental frequency f;

using a second oscillator for supplying the selectable frequency sequence S of logic signals 0 and 1 to be maintained in synchronism with the signals of the reference signal $R_f$;

providing said second oscillator with means enabling it to supply the sequence of pulses S at a selected one of three fixed frequencies, i.e.:
  a) the fundamental frequency f,
  b) a second frequency $f_1$ slightly higher than f,
  c) a third frequency $f_2$ slightly lower than f;

permanently comparing the phases of the signals of the selectable frequency sequence S and the reference sequence $R_f$, using a phase detector able to determine the synchronism, lead and lag states of the sequence S compared with the reference sequence $R_f$ in accordance with the following rules:
  a) if the leading fronts of the reference sequence $R_f$ pulses lead the leading fronts of the selectable frequency sequence S pulses by up to and including a first time $T_{Rf}$ then the phase detector notes a synchronism state, and if the leading fronts of the selectable frequency sequence S pulses lag the leading fronts of the references sequence $R_f$ pulses by more than the first time $T_{Rf}$ then the phase detector notes a lag state;

b) if the leading fronts of the selectable frequency sequence S pulses lead the leading fronts of the reference sequence $R_f$ pulses by up to and including a second time $T_s$ then the phase detector notes the synchronism state, and if the leading fronts of the selectable frequency sequence S pulses by more than the second time $T_s$ then the phase detector notes a lead state;

controlling the oscillator S on the basis of information from the phase detector, so that it oscillates:

at the fundamental frequency f if the phase detector has noted a synchronism state, at the second frequency $f_1$ if the phase detector has noted a lag state of S compared with $R_f$, at frequency $f_2$, if the phase detector has noted a lead state of S compared with $R_f$.

The device according to the invention, in the manner defined hereinbefore, has remarkable advantages compared with the prior art devices.

The analysis of the phase shift of the sequence of the reference pulses $R_f$ compared with the sequence of pulses S performed by the phase detector takes place by observing the arrival of an event inside or outside not two instants as was the case in the prior art, but one instant (the leading front of a pulse S or $R_f$) with a duration ($T_{Rf}$ or $T_s$). This manner of evaluating the phase shift is much simpler to use by electronic circuits than the known procedure. There is also an improvement in stability to the extent that there is no systematic correction during each cycle and instead a phase shift tolerance by a given quantity and a given time interval are allowed between the two signals.

Moreover, the device does not calculate the extent of the phase shift when one occurs, as is always the case in the prior art (cf. e.g. U.S. Pat. No. 4,121,171). It merely examines the situation of the pulse sequences $R_f$ and S and merely states whether there is a synchronism, lead or lag state of S compared with $R_f$.

On the basis of a noted phase shift situation, the device does not calculate the extent thereof, which has no influence on the correction made, because the latter only takes place by modifying the frequency of the oscillator of the loop in order to bring it to one of the two values fixed beforehand, one above and the other below the nominal frequency f. The correction then applied to the pulse sequence S lasts one or more periods or cycles until the phase detector again detects a synchronism situation.

The values currently chosen for $T_{Rf}$ and $T_s$ are not critical, but are below half an oscillating cycle of the system, e.g. 0.01 to 0.1 cycle. They can also be chosen equal to one another or not.

In other words, the time correction by which the pulses S are advanced or delayed compared with the reference pulses $R_f$ is calibrated, i.e. both for the lead and for the lag, it has a certain predetermined value and which is always the same throughout the performance of the process. This second feature also leads to a simplification in the construction of the apparatus, but without compromising the accuracy of the result.

It is useful to point out the novel, important differences distinguishing the device according to the invention from the prior art phase locked loops. Thus, in the latter, the two oscillators are frequency-dependent on one another and if the "leading" oscillator changes frequency, even if this is to a significant extent, the "lead" oscillator is made to follow. However, in the invention, the two oscillators oscillate at the same fundamental frequency for the sequence $R_f$ and this is identical or only very slightly different during a short lag time for the sequence S. The process for the correction of the phase shift of the pulses S according to the invention, makes it impossible for the pulses S to frequency follow a significant slide, which occurs in the frequency of the pulses $R_f$, which it is wished to be as stable as possible.

The operating procedure described hereinbefore in general terms corresponds to a normal time operation and to a monitoring of the pulses of two sequences, when they only differ very slightly from the ideal synchronization by a value which is usually well below a half cycle.

However, operating cases exist where this is not always the case, particularly after a stoppage of the apparatus leading to a restarting, where the two pulse sequences are in a random phase shift situation with respect to one another, or e.g. during a significant phase shift resulting from an incident in the operation of the generator for the pulses $R_f$.

In such cases, particularly when the phase shift reaches values of half a cycle, it is no longer possible to decide in accordance with the preceding criteria if one or other of the sequences is in a lead or lag situation with respect to the other. Thus, this notion is dependent on the order of the pulse to which reference is being made and a given situation can be analysed both as an advance or lead compared with a reference pulse or a delay or lag compared with the preceding pulse. To solve this type of difficulty, the invention also relates to a variant of the synchronization process making it possible to clarify the possibly ambiguous situations compared with a lead or lag state during a significant phase shift.

This variant of the synchronization process usable for large, accidental phase shifts, particularly when starting up the process, consists of using special rules for the determination of the lead or lag states of the sequence S compared with the reference sequence $R_f$, according to which:

the phase detector notes a lag state of the pulses S compared with the pulses $R_f$ when the leading front of the pulses $R_f$ occurs during the state zero of the pulses S;

the phase detector notes a lead state of the pulses S compared with the pulses $R_f$, when the leading front of the pulses $R_f$ occurs during the state 1 of the pulses S.

In this synchronization process variant, all the other stages are identical to those of the process described hereinbefore for the rephasing in the case of small phase shifts.

Thus, as the criterion is clearly defined, there can no longer be any ambiguity during a significant phase shift and e.g. a restarting of the phase locked loop. Obviously, the synchronization process can take place, according to the programming of the apparatus, either by reestablishing the general process described hereinbefore, in which case said second making-good process only has a transitory function, or by maintaining the preceding variant of comparing the leading from $R_f$ with the states 0 and 1 of S, in which case there is a maintenance in phase at a zero mean value of S with $R_f$, because the apparatus permanently carries out small corrections around the strict synchronism which it no longer detects.

The latter manner of proceeding consequently corresponds to a third variant of the general synchronization process in which:

a permanent comparison takes place between the phases of the signals of the same frequency S and $R_f$ using a phase detector able to determine the synchronism, lead or lag states of the sequence S compared with the reference sequence $R_f$ according to the following rules:

a) if the leading front of the pulses $R_f$ precedes the leading front of the pulses S and if the latter occurs in a time $T_{Rf}$ following the leading front of the preceding pulse $R_f$, the phase detector notes a synchronism state;

b) if the leading front of the pulses S precedes the leading front of the pulses $R_f$ and if the latter occurs in a time $T_s$ after the leading front of the preceding pulse S, the phase detector notes a synchronism state;

c) in the absence of synchronism, use is made of the following rules for the determination of the lead or lag states of the sequence S compared with the reference sequence $R_f$:

the phase detector notes a lag state of the pulses S compared with the pulses $R_f$, when the leading front of the pulses $R_f$ occurs during the state zero of the pulses S;

the phase detector notes a lead state of the pulses S compared with the pulses $R_f$, when the leading front of the pulses $R_f$ occurs during state 1 of the pulses S;

The oscillator S is controlled on the basis of the information from the phase detector, so that it oscillates:

at the fundamental frequency f if the phase detector has noted a synchronism state between S and $R_f$, at frequency $f_1$ if the phase detector has noted a lag state of S compared with $R_f$, at frequency $f_2$ if the phase detector has noted a lead state of S compared with $R_f$.

In this third variant of the process according to the invention, all the other stages, particularly the two oscillators, whereof the second produces the sequence S and is able to oscillate on the three frequencies f, $f_1$ and $f_2$, are identical to those of the general process.

The invention also relates to a synchronizing device for maintaining in the vicinity of zero the average phase shift between two digital pulse sequences S and $R_f$ of the same fundamental high frequency f and comprising:

a first reference oscillator producing the sequence $R_f$ of logic signals 0 and 1 at the constant fundamental frequency f;

a second annular oscillator comprising three loops, whereof each has an uneven number of inverted logic gates, a first loop whereof the oscillating frequency corresponds to the nominal frequency f of the pulses $R_f$, a second loop whereof the oscillating frequency $f_1$ slightly exceeds the nominal frequency f and a third loop whereof the oscillating frequency $f_2$ is slightly below the nominal frequency f;

a phase detector receiving the pulses $R_f$ and S and able to determine the synchronism, lead or lag states of the sequence S compared with the reference sequence $R_f$;

a multiplexer controlling the choice of one of the three preceding loops for the operation of the annular oscillator;

coupling means between the multiplexer and the phase detector enabling the latter to control the choice of the multiplexer in favour of the:

first loop if a lag situation of the pulses S compared with the pulses $R_f$ has been detected, second loop if a lag situation of the pulses S compared with the pulses $R_f$ has been detected, third loop if a lead situation of the pulses S compared with the pulses $R_f$ has been detected.

According to a first variant of the above device, the rules for determining the synchronism, lead or lag states of the pulses S compared with the pulses $R_f$ are as follows:

a) if the leading front of the pulses $R_f$ precedes the leading front of the pulses S and if the latter occurs in a time $T_{Rf}$ following the leading front of the preceding pulse $R_f$, the phase detector notes a synchronism state and in the opposite case, i.e. the leading front of the pulses S occurs after the time $T_{Rf}$, the phase detector notes a phase shift state of S lagging compared with $R_f$;

b) if the leading front of the pulses S precedes the leading front of the pulses $R_f$ and if the latter occurs in a time $T_s$ following the leading front of the preceding pulses S, the phase detector notes a synchronism state and in the opposite case, i.e. if the leading front of the pulses $R_f$ occurs after the time $T_s$, the phase detector notes a phase shift state of S leading compared with $R_f$.

According to a second variant used for large phase shifts of in particular an accidental nature, the rules for the determination of the synchronism, lead or lag states of the pulses S compared with the pulses $R_f$ are as follows:

the phase detector notes a lag state of the pulses S compared with the pulses $R_f$, when the leading front of the pulses $R_f$ occurs during the state 0 of the pulses S;

the phase detector notes a lead state of the pulses S compared with the pulses $R_f$, when the leading front of the pulses $R_f$ occurs during state 1 of the pulses S.

The preceding synchronization device makes it possible, as shown, to perform the preceding process using as the oscillator, a digitally controlled annular oscillator having three loops, each constituted by an uneven number of inverted logic gates, each of the three loops having its own predetermined oscillating frequency calibrated by the number of logic gates. Thus, in a structure of this nature it is, as will be explained hereinafter relative to FIG. 2, the propagation time of the electric signal through each of the three logic gate loops, which determines the three possible oscillating frequencies of said oscillator. The number of gates of the three loops is determined so that one of the loops corresponds to a zero correction and consequently to the synchronous operation of the oscillator with the sequence of signals $R_f$, each of the two others corresponding to an accelerated oscillating frequency for one and a decelerated oscillating frequency for the other compared with the theoretical synchronization frequency f of the signals $R_f$. According to the invention, it is the phase detection system which controls a multiplexer forming an integral part of the oscillator for choosing the particular loop (nominal, acceleration or deceleration) appropriate at each instant as a function of observations made by the phase detector.

If reference is now made to the known circuit shown in FIG. 2, which is a ring looped on itself and having in series an uneven number of inverted logic gates, it can be seen that as a result of the uneven number of said gates, the output signal of the gates is opposite to the input signal, so that the loop closed on itself in this way starts to automatically oscillate, because the arrangement of FIG. 2 is by definition electronically unstable. The oscillating frequency of such a ring results from the propagation time of the electric signal through all the logic gates. If this time is called T, a time equal to 2 T is necessary for the system to return to the same logic state and consequently its oscillating frequency is equal to $F = \frac{1}{2}T$. It is the known basic diagram which is used by the device according to the invention in the form of three inverted gate loops equipping the oscillator, whose phase is to be monitored.

With regards to the values of the frequencies chosen for the loops of the oscillator at increased frequency $f_1$ and decreased frequency $f_2$ compared with the nominal frequency $R_f$, they result from the following considerations. The device operating with an annular oscillator, closed on an uneven number of inverted gates, a choice is firstly made of the number $(2n+1)$, of the gates corresponding to the nominal loop oscillating at the frequency f of the pulses $R_f$. The loop is brought to the lower frequency $f_2$ by placing there a higher number of gates, usually two more units, i.e. $(2n+3)$ and the loop is brought to the higher frequency $f_1$ by placing there a smaller number of gates, e.g. two fewer gates, i.e. $(2n-1)$.

BRIEF DESCRIPTION OF THE DRAWINGS

The invention will be better understood from the following description of non-limitative embodiments and with reference to the attached FIGS. 3 to 8, wherein show:

FIG. 7 (FIGS. 7a, b and c) lag and lead situations in the variant of the process used for making good phase shifts of approximately ½ cycle, namely:

DESCRIPTION OF THE PREFERRED EMBODIMENTS

Figure 1:
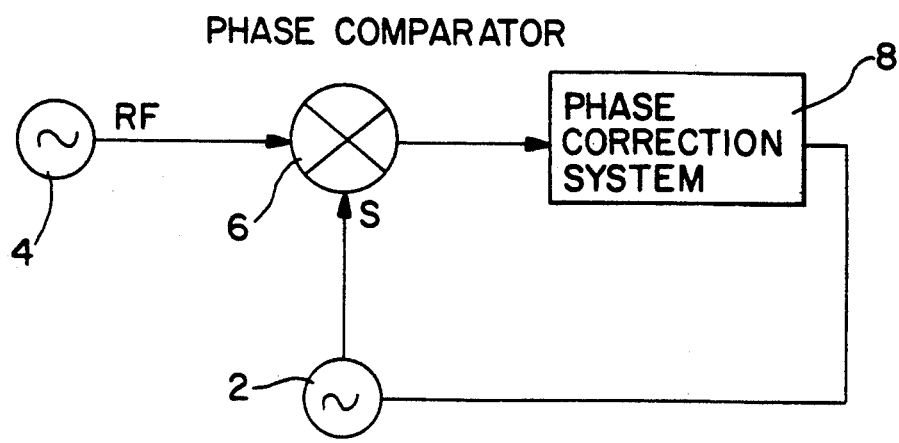
FIG. 1 is a prior art illustration of a phase locked loop arrangement.
Figure 2:
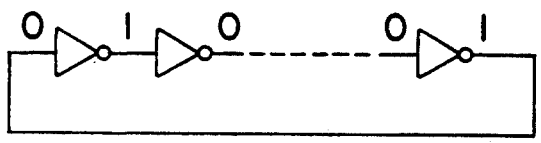
FIG. 2 is a prior art illustration of a ringed loop having an uneven number of inverted logic gates.
Figure 3:
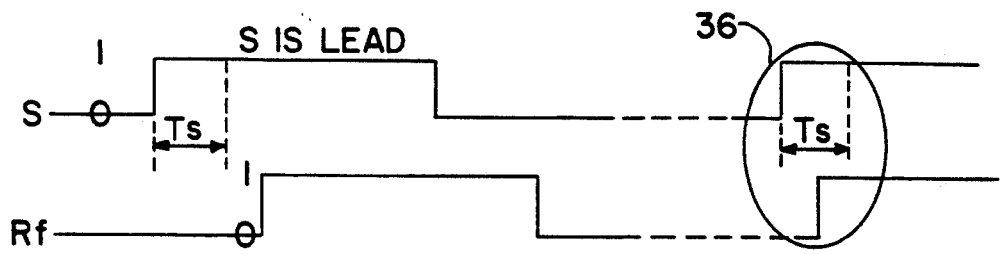
FIG. 3 is a configuration with S leading $R_f$.

In FIG. 3 the leading fronts of the pulses S precede the leading fronts of the pulses $R_f$. The time $T_s$ originating at each leading front of a pulse S is shown. The leading front from state 0 to state 1 of $R_f$ occurs after the end of the time $T_s$, so that the phase detector decides that the pulses S lead compared with the pulses $R_f$. The reestablishment of the synchronism situation takes place automatically by passing the second oscillator to the slow frequency $f_2$ for the number of cycles necessary to obtain the synchronism position shown at 36 in FIG. 3.

Figure 4:
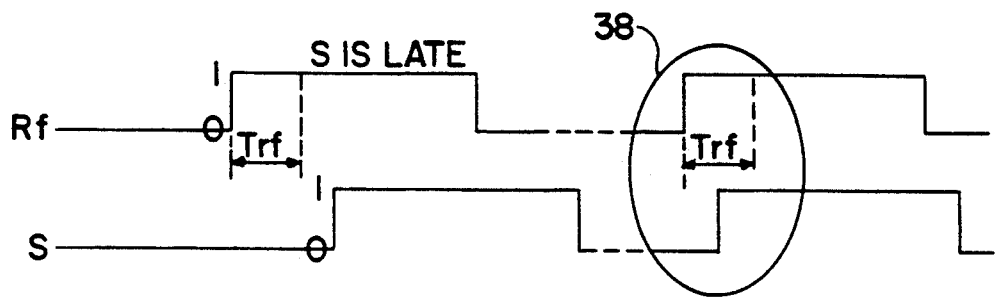
FIG. 4 is a configuration with S lagging $R_f$.

In FIG. 4, the leading fronts of the pulses $R_f$ precede the leading fronts of the pulses S. The time $T_{Rf}$ originating at each leading front of a pulse $R_f$ is shown. The leading front of state 0 to state 1 of S occurs after the end of the time $T_{Rf}$, so that the phase detector considers that the pulses S are lagging compared with the pulses $R_f$.

The reestablishment of the synchronism situation takes place automatically by passing the second oscillator to the fast frequency $f_1$ under the control of the phase comparator and maintaining said frequency $f_1$ for the number of cycles necessary for reestablishing the synchronism situation shown at 38 in FIG. 4.

Figure 5:
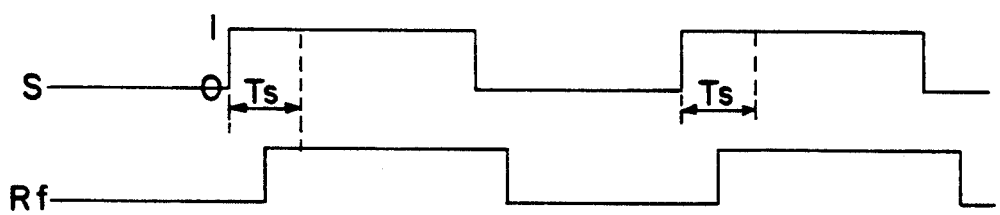
FIG. 5 a synchronism configuration of S and $R_f$.

In FIG. 5, the front of the pulses S precedes the front of the pulses $R_f$ and the latter are within the time $T_s$. According to the rules defined, the phase comparator considers that there is synchronism between the two pulse sequences and maintains the system at frequency f.

Figure 6:
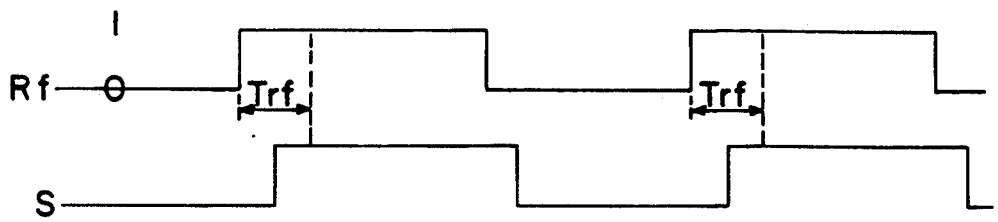
FIG. 6 a synchronism configuration of S and $R_f$.

In FIG. 6, the pulse fronts $R_f$ precede the pulse fronts S and are within the time $T_{Rf}$. According to the rules defined, the phase comparator considers that there is synchronism between the two pulse sequences and maintains the system at frequency f.

With reference to FIG. 7 a description will now be given of the performance of the process in the case of a transient operation during which the phase shift between the pulses of the two sequences S and $R_f$ can assume very high values, e.g. as a result of a restarting, following a stoppage of the apparatus, or as a result of a major technical incident having caused an exceptional phase shift.

In such a case, in order that the process can restart with continuous operation, it is necessary to unambiguously define whether there is a synchronism, lead or lag configuration. Thus, when the phase shift between the pulses of sequence S and the pulses of $R_f$ is high and in particular close to phase opposition, the choice between the lead and lag hypotheses becomes arbitrary, because a pulse is necessary in advance of that following it and behind that preceding it.

Figure 7A:
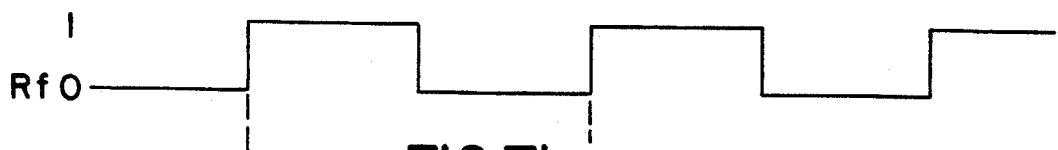
FIG. 7a the reference sequence $R_f$ at frequency f.

FIG. 7a shows the sequence $R_f$ of reference pulses at the fundamental frequency f.

Figure 7B:
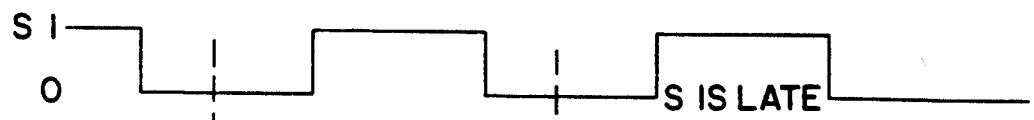
FIG. 7b a lag configuration of S compared with $R_f$.
Figure 7C:
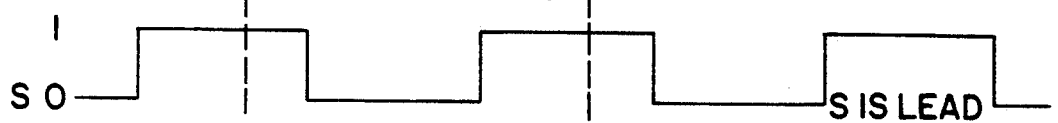
FIG. 7c a lead configuration of S compared with $R_f$.

FIGS. 7b and 7c show in the case of the variant of making good significant phase shifts, respectively a lag configuration of S compared with R and a lead configuration of S compared with $R_f$. These configurations, estimated by the phase comparator, result from the state 0 of S at the time of a leading front of the pulses $R_f$ (for the lag state of S compared with $R_f$) and the state 1 of S at the time of a leading front of the pulses $R_f$ (for a lead state of S compared with $R_f$).

The corrections necessary for the return to the synchronism state are carried out by switching, for the number of cycles necessary, the frequency of the second oscillator producing the sequence S, on frequency $f_1$ if S is lagging and on frequency $f_2$ if S is leading. This is automatically controlled by the phase comparator acting on the multiplexer of the oscillator S as a function of the lead or lag state which it has determined.

Figure 8:
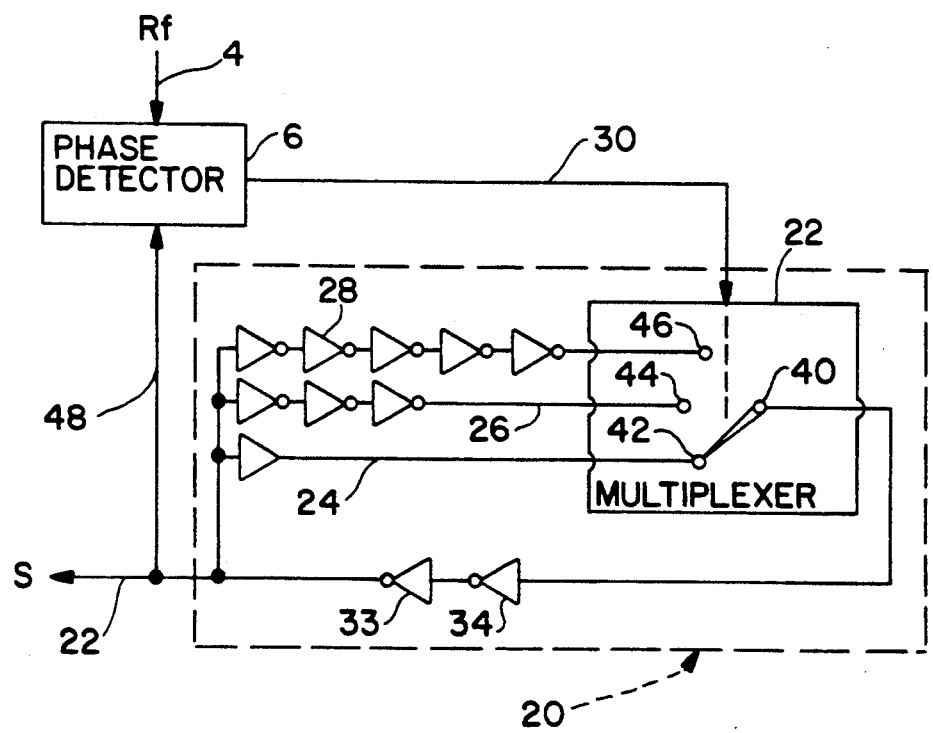
FIG. 8 a diagram of the synchronization device.

Finally, FIG. 8 shows the synchronization device according to the invention which, like the prior art devices, has an input 4 for the sequence of reference pulses $R_f$ at constant frequency, as well as a phase detecting circuit 6. The latter receives by the line 48 the pulses S present on the output line 32 of the oscillator 20. According to the invention, the oscillator of the synchronization device is a digital ring 20 looped onto itself by means of a multiplexer 22 making it possible to choose between three loops 24, 26 and 28 respectively, said three loops being provided with inverted logic gates in series and in an uneven number in order to ensure the oscillation of the ring. In the embodiment described, the circuit 24 has three logic gates, the loop 26 five and the loop 28 seven. Two gates 33,34 are common to the three preceding loops. These numbers of gates are given in a non-limitative, illustrative manner, it being understood that each of the three circuits is respectively intended, with regards the circuit 24 for the introduction of an acceleration of the oscillator 20 at the frequency $f_1$, with regards to the circuit 26 to the operation of the oscillator 20 at its fundamental frequency f, and with regards to the circuit 28 to supplying a phase lag by the temporary deceleration of the oscillator 20 at frequency $f_2$. All that is important is that the passage time of each of the loops by the electrons and which in each particular case corresponds to the introduction of an acceleration, a zero correction or a deceleration, under the influence of the information supplied by the phase detector 6 and which acts by means of the control 30 on the multiplexer 22 of the oscillating loop. To this end, the multiplexer 22 has a selector 40 able to switch into one of the three positions 42,44 and 46, whereof each corresponds to one of the three loops 24,26,28. The output of the signals S, maintained strictly in phase with the reference signals $R_f$, take place by the loop 32. The frequencies $f_1$ (higher) and $f_2$ (lower) than the frequency f (fundamental) are usually very close to $f_1$. For example, it is possible to choose $f_1 \simeq 1.10$ f and $f_2 \simeq 0.90$ f without these values being considered as limitative.

Another example given with reference to the device of FIG. 8 is as follows. Use is made of inverted logic gates, each introducing a lag of 2 nanoseconds for the signal passing through them. Under these conditions, the nominal loop 26 has a cycle of $2 \times 5 = 10$ ns and a frequency f = 100 MHz, the loop 24 a cycle of $2 \times 3 = 6$ ns and a frequency $f_1 = 167$ MHz and the loop 20 a cycle of $2 \times 7 = 14$ ns corresponding to a frequency of $f_2 = 71.4$ MHz. Thus, the characteristics and number of gates are chosen so that the nominal loop oscillates at a frequency which is as close as possible to the frequency f of the sequence of reference pulses $R_f$.

The devices according to the invention have a stable frequency, which is rapidly correctable in digital form. Moreover, since in accordance with the process of the invention, the phase comparator is made to make a comparison between two periodic signals, whilst taking into account the leading front of one and a time range for the other, a considerable advantage is provided compared with the prior art phase locked loops.

We claim:

1. Synchronization process for maintaining in the vicinity of zero the average phase difference between two digital pulse sequences one of which is a selectable frequency sequence S and the other of which is a reference frequency sequence $R_f$, of the same high average fundamental frequency f consisting of:

using a first oscillator to provide the reference frequency sequence $R_f$ of logic signals 0 and 1 at the constant fundamental frequency f;

using a second oscillator for supplying the selectable frequency sequence S of logic signals 0 and 1 on average at the constant theoretical fundamental frequency f and maintaining synchronism with the signals of the reference sequence $R_f$;

providing said second oscillator with means enabling it to supply the sequence of pulses S at a selected one of three fixed frequencies, namely;

a) the fundamental frequency f,
b) a second frequency $f_1$ slightly higher than the fundamental frequency f,
c) a third frequency $f_2$ slightly lower than the fundamental frequency f;

permanently comparing the phases of the selectable frequency sequence S and the reference sequence $R_f$ using a phase detector in accordance with the following rules:

a) if the leading fronts of the reference sequence $R_f$ pulses lead the leading fronts of the selectable frequency sequence S pulses by up to and including a first time $T_{Rf}$ then the phase detector notes a synchronism state, and if the leading fronts of the selectable frequency sequence S pulses lag the leading fronts of the references sequence $R_f$ pulses by more than the first time $T_{Rf}$ then the phase detector notes a lag state;

b) if the leading fronts of the selectable frequency sequence S pulses lead the leading fronts of the reference sequence $R_f$ pulses by up to and including a second time $T_s$ then the phase detector notes the synchronism state, and if the leading fronts of the reference sequence $R_f$ pulses lag the leading fronts of the selectable frequency sequence S pulses by more than the second time $T_s$ then the phase detector notes a lead state;

controlling the second oscillator on the basis of information from the phase detector in such a way that it oscillates at:

the fundamental frequency f if the phase detector has noted a synchronism state, the second frequency $f_1$ if the phase detector has noted the lag state, and the third frequency $f_2$ if the phase detector has noted the lead state.

2. Synchronization process according to claim 1, usable for large, accidental phase shifts, particularly during the starting up of the process further consisting of using particular determination rules for the lead or lag states of the selectable frequency sequence S compared with the reference sequence $R_f$ in accordance with whether:

the phase detector notes a lag state of the selectable frequency sequence S pulses compared with the reference sequence $R_f$ pulses, which will occur when the leading front of the reference sequence $R_f$ pulses occurs during the state 0 of the selectable frequency sequence S pulses; or the phase detector notes a lead state of the selectable frequency sequence S compared with the reference sequence $R_f$ pulses, which will occur when the leading front of the reference sequence $R_f$ pulses occurs during the state 1 of the selectable frequency sequence S pulses.

3. Synchronization device for maintaining in the vicinity of zero the average phase difference between two digital pulse sequences one of which is a selectable frequency sequence S and the other of which is a reference frequency sequence $R_f$, of the same high fundamental frequency f comprising:

a reference oscillator for producing the pulse sequence for the reference frequency $R_f$ of logic signals 0 and 1 at the constant fundamental frequency f;

a ring oscillator comprising three loops, each of which has an uneven number of inverted logic gates, including a first loop wherein the oscillating frequency corresponds to the nominal frequency f of the reference frequency $R_f$ pulses, a second loop having an oscillating frequency $f_1$ slightly higher than the nominal frequency f and a third loop having an oscillating frequency $f_2$ slightly lower than the nominal frequency f;

a phase detector receiving the reference frequency $R_f$ pulses and the selectable frequency S pulses to determine the synchronism, lead or lag state of the selected frequency S sequence compared with the reference frequency $R_f$ sequence; and for providing an output signal indicative of the state of the selected frequency sequence;

a multiplexer responsive to the output signal of said phase detector for selecting between one of said preceding loops in said ring oscillator;

coupling means located between the multiplexer and the phase detector for enabling the latter to direct the selection of the multiplexer in favour of the:

first loop if it has detected a state situation of the pulses S compared with the pulses $R_f$, wherein the nominal frequency f corresponds to the oscillating frequency, second loop if it has detected a lag state, and third loop if it has detected a lead state.

4. Synchronization device according to claim 3, characterized in that the rules for the determination of the synchronism, lead or lag state are as follows:

if the leading fronts of the reference sequence $R_f$ pulses lead the leading fronts of the selectable frequency sequence S pulses by up to and including a first time $T_{Rf}$ then the phase detector notes a synchronism state, and if the leading fronts of the selectable frequency sequence S pulses lag the leading fronts of the references sequence $R_f$ pulses by more than the first time $T_{Rf}$ then the phase detector notes a lag state;

b) if the leading fronts of the selectable frequency sequence S pulses lead the leading fronts of the reference sequence $R_f$ pulses by up to and including a second time $T_s$ then the phase detector notes the synchronism state, and if the leading fronts of the reference sequence $R_f$ pulses lag the leading fronts of the selectable frequency sequence S pulses by more than the second time $T_s$ then the phase detector notes a lead state.

5. Synchronization device according to claim 3, characterized in that the determination rules for the synchronism, lead or lag states are as follows:

the phase detector notes a lag state of the selectable frequency sequence S pulse compared with the reference sequence $R_f$ pulses when the leading front of the pulses $R_f$ occurs during the state zero of the selectable frequency sequence S pulse;

the phase detector notes a lead state of the selectable frequency sequence S pulses compared with the reference sequence pulses, when the leading front of the reference sequence $R_f$ pulses occurs during the state 1 of the selectable frequency S pulses.

6. Synchronization process for maintaining in the vicinity of zero the average phase difference between two digital pulse sequences one of which is a selectable frequency sequence S and the other of which is a reference frequency sequence $R_f$, of the same high fundamental frequency f consisting of:

using a first sequence oscillator to provide the reference frequency $R_f$ of logic signals 0 and 1 at the constant fundamental frequency f;

using a second oscillator for supplying the selectable frequency sequence S of logic signals 0 and 1 at the constant theoretical fundamental frequency f and maintaining synchronism with the signals of the reference sequence $R_f$;

providing said second oscillator with means enabling it to supply the sequence of pulses S at a selected one of three fixed frequencies, namely:

a) the fundamental frequency f, b) a second frequency $f_1$ slightly higher than the fundamental frequency f, c) a third frequency $f_2$ slightly lower than the fundamental frequency f;

permanently comparing the phases of the selectable frequency sequence S and the reference sequence $R_f$ using a phase detector in accordance with the following rules:

a) if the leading fronts of the reference sequence $R_f$ pulses lead the leading fronts of the selectable frequency sequence S pulses by up to and including a first time $T_{Rf}$ then the phase detector notes a synchronism state, and if the leading fronts of the selectable frequency sequence S pulses lag the leading fronts of the references sequence $R_f$ pulses by more than the first time $T_{Rf}$ then the phase detector notes a lag state;

b) if the leading fronts of the selectable frequency sequence S pulses lead the leading fronts of the reference sequence $R_f$ pulses by up to and including a second time $T_s$ then the phase detector notes the synchronism state, and if the leading fronts of the reference sequence $R_f$ pulses lag the leading fronts of the selectable frequency sequence S pulses by more than the second time $T_s$ then the phase detector notes a lead state, c) in the absence of synchronism, the following rules are used for determining the lead or lag state:

the phase detector notes a lag state when the leading front of the reference sequence pulses occurs during the state 0 of the selectable frequency sequence S pulses;

the phase detector notes a lead state when the leading front of the reference sequence $R_f$ pulses occurs during the state 1 of the selectable frequency sequence pulses;

controlling the second oscillator on the basis of information from the phase detector in such a way that it oscillates:

at said fundamental frequency f if the phase detector has noted a synchronism state;

at said frequency $f_1$ if the phase detector has noted a lag state; and at said frequency $f_2$ if the phase detector has noted a lead state.

* * * * *